(12) United States Patent
Saitoh et al.

(10) Patent No.: US 10,177,233 B2
(45) Date of Patent: Jan. 8, 2019

(54) SILICON CARBIDE SEMICONDUCTOR DEVICE

(71) Applicant: Sumitomo Electric Industries, Ltd., Osaka-shi (JP)

(72) Inventors: Yu Saitoh, Osaka (JP); Takashi Tsuno, Osaka (JP); Toru Hiyoshi, Osaka (JP); Kosuke Uchida, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/566,342

(22) PCT Filed: Apr. 28, 2016

(86) PCT No.: PCT/JP2016/063379
§ 371 (c)(1),
(2) Date: Oct. 13, 2017

(87) PCT Pub. No.: WO2016/181862
PCT Pub. Date: Nov. 17, 2016

(65) Prior Publication Data
US 2018/0114843 A1 Apr. 26, 2018

(30) Foreign Application Priority Data
May 13, 2015 (JP) .................... 2015-098560

(51) Int. Cl.
*H01L 21/66* (2006.01)
*H01L 29/40* (2006.01)
(Continued)

(52) U.S. Cl.
CPC .......... *H01L 29/408* (2013.01); *H01L 21/046* (2013.01); *H01L 21/049* (2013.01);
(Continued)

(58) Field of Classification Search
CPC ............. H01L 29/1608; H01L 29/7813; H01L 29/4236; H01L 29/7397; H01L 29/045; H01L 29/1095
See application file for complete search history.

(56) References Cited

U.S. PATENT DOCUMENTS 9,318,600 B2 * 4/2016 Kudou ................ H01L 29/7813
2010/0308343 A1 * 12/2010 Suzuki ................ H01L 21/0465
257/77
(Continued)

FOREIGN PATENT DOCUMENTS

JP S62-32648 A 2/1987
JP 2007-080971 A 3/2007
(Continued)

OTHER PUBLICATIONS

Written Submission of Certificate concerning Exception to Lack of Novelty, which was filed in the basic Japanese application of the subject application.
(Continued)

*Primary Examiner* — Jaehwan Oh
(74) *Attorney, Agent, or Firm* — Venable LLP; Michael A. Sartori; Laura G. Remus

(57) ABSTRACT

A silicon carbide semiconductor device includes a gate insulating film and a gate electrode. A first main surface is provided with a trench defined by a side surface penetrating a third impurity region and a second impurity region to reach a first impurity region, and a bottom provided continuously with the side surface. In a stress test in which a gate voltage of at least one of −10 V and 20 V is applied to the gate electrode for 100 hours at a temperature of 175° C., where a threshold voltage before the stress test is defined as a first threshold voltage and a threshold voltage after the stress test is defined as a second threshold voltage, an absolute value of a difference between the first threshold voltage and the
(Continued)

second threshold voltage is not more than 0.25 V. The second threshold voltage is not less than 2.5 V.

4 Claims, 12 Drawing Sheets

(51) Int. Cl.
    *H01L 21/04*     (2006.01)
    *H01L 23/482*     (2006.01)
    *H01L 29/04*     (2006.01)
    *H01L 29/423*     (2006.01)
    *H01L 29/66*     (2006.01)
    *H01L 29/78*     (2006.01)
    *H01L 29/16*     (2006.01)

(52) U.S. Cl.
    CPC .......... *H01L 22/10* (2013.01); *H01L 23/4824* (2013.01); *H01L 29/045* (2013.01); *H01L 29/4236* (2013.01); *H01L 29/66068* (2013.01); *H01L 29/7813* (2013.01); *H01L 29/1608* (2013.01)

(56) References Cited

U.S. PATENT DOCUMENTS

| | | | |
|---|---|---|---|
| 2012/0228637 A1* | 9/2012 | Nakabayashi | H01L 21/046 257/77 |
| 2013/0112996 A1 | 5/2013 | Masuda | |
| 2013/0306986 A1* | 11/2013 | Wada | H01L 21/3065 257/77 |
| 2014/0077262 A1* | 3/2014 | Zundel | H01L 29/7811 257/141 |
| 2014/0110723 A1* | 4/2014 | Ikegami | H01L 29/7802 257/77 |
| 2015/0179791 A1* | 6/2015 | Kudou | H01L 29/7813 257/77 |

FOREIGN PATENT DOCUMENTS

| | | |
|---|---|---|
| JP | 2013-110336 A | 6/2013 |
| JP | 2013-232533 A | 11/2013 |
| JP | 2015-053359 A | 3/2015 |
| JP | 2015-060859 A | 3/2015 |
| JP | 2015-065288 A | 4/2015 |
| JP | 2015-111645 A | 6/2015 |
| JP | 2015-226060 A | 12/2015 |
| WO | 2012/017798 A9 | 2/2012 |

OTHER PUBLICATIONS

Uchida et al., "Characterization of V-groove trench SiC MOSFETs with Buried Structures", Proceedings of the 1st Lecture of Advanced Power Semiconductors, pp. 190-191, The Japan Society of Applied Physics, Advanced Power Semiconductors [Cited in Written Submission of Certificate].

Uchida et al., "Characterization of V-groove trench SiC MOSFETs with Buried Structures", Poster Lecture on Nov. 19, 2014, 1st Lecture of Advanced Power Semiconductors, The Japan Society of Applied Physics, Advanced Power Semiconductors [Cited in Written Submission of Certificate].

Uchida et al., "The Optimised Design and Characterization of 1200 V / 2.0 mΩ cm2 4H-SiC V-groove Trench MOSFETs", Proceedings of the 27th International Symposium on Power Semiconductor Devices & ICs, May 10-14, 2015, pp. 85-88, IEEE [Cited in Written Submission of Certificate].

Uchida et al., "The Optimized Design and Characterization of 1200 V / 2.0 mΩ cm2 4H-SiC V-groove Trench MOSFETs", Oral Presentation on May 12, 2015, The 27th International Symposium on Power Semiconductor Devices and ICs [Cited in Written Submission of Certificate].

* cited by examiner

SILICON CARBIDE SEMICONDUCTOR DEVICE

TECHNICAL FIELD

The present disclosure relates to silicon carbide semiconductor devices. This application claims priority to Japanese Patent Application No. 2015-098560 filed on May 13, 2015, the entire contents of which are incorporated herein by reference.

BACKGROUND ART

WO 2012/017798 (PTD 1), for example, discloses a trench type MOSFET (Metal Oxide Semiconductor Field Effect Transistor) having a gate trench provided in a main surface of a silicon carbide substrate.

CITATION LIST

Patent Document

PTD 1: WO 2012/017798

SUMMARY OF INVENTION

A silicon carbide semiconductor device according to the present disclosure includes a silicon carbide substrate, a gate insulating film, and a gate electrode. The silicon carbide substrate has a first main surface and a second main surface opposite to the first main surface. The silicon carbide substrate includes a first impurity region having a first conductivity type, a second impurity region provided on the first impurity region and having a second conductivity type different from the first conductivity type, and a third impurity region provided on the second impurity region so as to be spaced from the first impurity region and having the first conductivity type. The first main surface is provided with a trench, the trench defined by a side surface penetrating the third impurity region and the second impurity region to reach the first impurity region, and a bottom provided continuously with the side surface. The first main surface is a {0001} plane, or a plane inclined at an angle of not more than 8° in an off direction relative to the {0001} plane. An angle formed between the first main surface and the side surface is not less than 95° and not more than 130°. The gate insulating film is in contact with the second impurity region at the side surface. The gate electrode is provided on the gate insulating film. In a stress test in which a gate voltage of at least one of −10 V and 20 V is applied to the gate electrode for 100 hours at a temperature of 175° C., where a threshold voltage before the stress test is defined as a first threshold voltage and a threshold voltage after the stress test is defined as a second threshold voltage, an absolute value of a difference between the first threshold voltage and the second threshold voltage is not more than 0.25 V. The second threshold voltage is not less than 2.5 V.

A silicon carbide semiconductor device according to the present disclosure includes a silicon carbide substrate, a gate insulating film, and a gate electrode. The silicon carbide substrate has a first main surface and a second main surface opposite to the first main surface. The silicon carbide substrate includes a first impurity region having a first conductivity type, a second impurity region provided on the first impurity region and having a second conductivity type different from the first conductivity type, and a third impurity region provided on the second impurity region so as to be spaced from the first impurity region and having the first conductivity type. The first main surface is provided with a trench, the trench defined by a side surface penetrating the third impurity region and the second impurity region to reach the first impurity region, and a bottom provided continuously with the side surface. The first main surface is a {0001} plane, or a plane inclined at an angle of not more than 8° in an off direction relative to the {0001} plane. An angle formed between the first main surface and the side surface is not less than 95° and not more than 130°. The gate insulating film is in contact with the second impurity region at the side surface. The gate electrode is provided on the gate insulating film. In a stress test in which a gate voltage of at least one of −10 V and 20 V is applied to the gate electrode for 100 hours at a temperature of 175° C., where a threshold voltage before the stress test is defined as a first threshold voltage and a threshold voltage after the stress test is defined as a second threshold voltage, a value obtained by dividing an absolute value of a difference between the first threshold voltage and the second threshold voltage by the second threshold voltage is not more than 0.08 V. The second threshold voltage is not less than 2.5 V.

DESCRIPTION OF EMBODIMENTS

Figure 1:
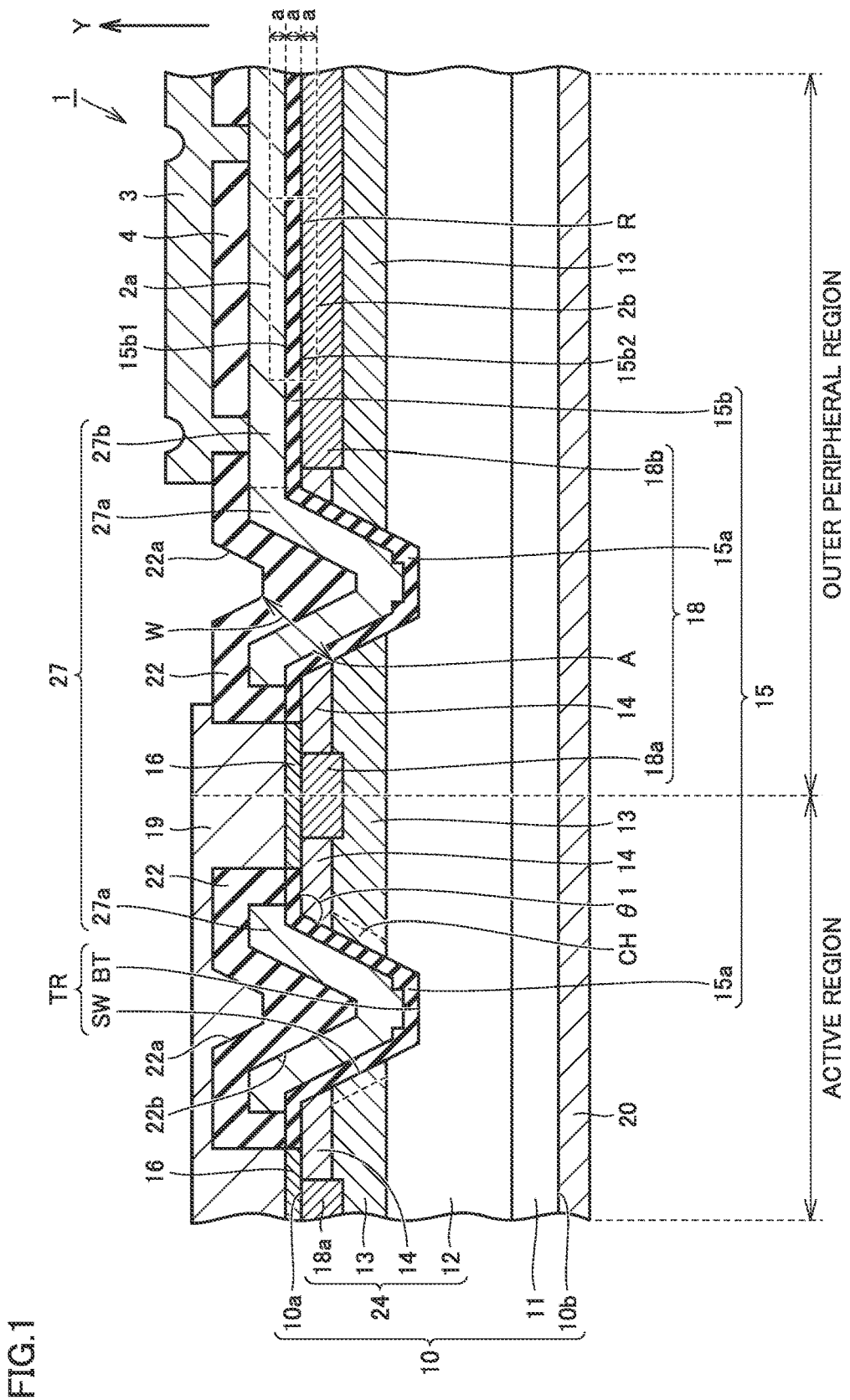
FIG. 1 is a schematic cross-sectional view showing the configuration of a silicon carbide semiconductor device according to an embodiment.

Problems to be Solved by the Present Disclosure

An object of the present disclosure is to provide a silicon carbide semiconductor device capable of achieving reduced variation in threshold voltage.

Effects of the Present Disclosure

According to the present disclosure, a silicon carbide semiconductor device capable of achieving reduced variation in threshold voltage can be provided.

Description of Embodiment

As one cause of variation in threshold voltage, the present inventors recognized the presence of sodium atoms in the vicinity of a gate insulating film. It is believed that sodium atoms present in the vicinity of a gate insulating film supply electric charges during operation of a MOFEST, causing variation in threshold voltage. Extensive research has found that the variation in threshold voltage due to gate bias stress can be reduced by setting the total number of sodium in the vicinity of the gate insulating film to a number lower than or equal to a certain number.

A certain concentration of sodium atoms exists in the atmosphere. It is thus believed that the sodium atoms are introduced in the vicinity of a gate insulating film in the process of manufacturing a silicon carbide semiconductor device. The diffusion of sodium atoms is more likely to progress particularly in a heat treatment step than in a manufacturing step at room temperature. It is thus believed that the sodium atoms in the atmosphere enter a gate electrode through the surface of an interlayer insulating film, particularly in the heat treatment step, and even diffuse to the vicinity of the gate insulating film. In an alloying annealing step of a source electrode, for example, a silicon carbide substrate is heated to about 1000° C., and thus it is believed that the sodium atoms are likely to diffuse to the vicinity of the gate insulating film.

In order to suppress the diffusion of sodium atoms to the gate insulating film, the alloying annealing may be performed with a thick silicon substrate disposed on the interlayer insulating film, for example. The silicon substrate is expected to absorb the sodium atoms, thereby suppressing the diffusion of sodium atoms to the gate insulating film. The diffusion of sodium to the gate insulating film may also be suppressed by increasing the thickness of the interlayer insulating film.

(1) A silicon carbide semiconductor device 1 according to the present disclosure includes a silicon carbide substrate 10, a gate insulating film 15, and a gate electrode 27. Silicon carbide substrate 10 has a first main surface 10a and a second main surface 10b opposite to first main surface 10a. Silicon carbide substrate 10 includes a first impurity region 12 having a first conductivity type, a second impurity region 13 provided on first impurity region 12 and having a second conductivity type different from the first conductivity type, and a third impurity region 14 provided on second impurity region 13 so as to be spaced from first impurity region 12 and having the first conductivity type. First main surface 10a is provided with a trench TR, the trench defined by a side surface SW penetrating third impurity region 14 and second impurity region 13 to reach first impurity region 12, and a bottom BT provided continuously with side surface SW. First main surface 10a is a {0001} plane, or a plane inclined at an angle of not more than 8° in an off direction relative to the {0001} plane. An angle θ1 formed between first main surface 10a and side surface SW is not less than 95° and not more than 130°. Gate insulating film 15 is in contact with second impurity region 13 at side surface SW. Gate electrode 27 is provided on gate insulating film 15. In a stress test in which a gate voltage of at least one of −10 V and 20 V is applied to gate electrode 27 for 100 hours at a temperature of 175° C., where a threshold voltage before the stress test is defined as a first threshold voltage and a threshold voltage after the stress test is defined as a second threshold voltage, an absolute value of a difference between the first threshold voltage and the second threshold voltage is not more than 0.25 V. The second threshold voltage is not less than 2.5 V. The silicon carbide semiconductor device capable of achieving reduced variation in threshold voltage can thereby be provided. In addition, the threshold voltage itself can be increased.

(2) A silicon carbide semiconductor device 1 according to the present disclosure includes a silicon carbide substrate 10, a gate insulating film 15, and a gate electrode 27. Silicon carbide substrate 10 has a first main surface 10a and a second main surface 10b opposite to first main surface 10a. Silicon carbide substrate 10 includes a first impurity region 12 having a first conductivity type, a second impurity region 13 provided on first impurity region 12 and having a second conductivity type different from the first conductivity type, and a third impurity region 14 provided on second impurity region 13 so as to be spaced from first impurity region 12 and having the first conductivity type. First main surface 10a is provided with a trench TR, the trench defined by a side surface SW penetrating third impurity region 14 and second impurity region 13 to reach first impurity region 12, and a bottom BT provided continuously with side surface SW. First main surface 10a is a {0001} plane, or a plane inclined at an angle of not more than 8° in an off direction relative to the {0001} plane. An angle θ1 formed between first main surface 10a and side surface SW is not less than 95° and not more than 130°. Gate insulating film 15 is in contact with second impurity region 13 at side surface SW. Gate electrode 27 is provided on gate insulating film 15. In a stress test in which a gate voltage of at least one of −10 V and 20 V is applied to the gate electrode for 100 hours at a temperature of 175° C., where a threshold voltage before the stress test is defined as a first threshold voltage and a threshold voltage after the stress test is defined as a second threshold voltage, a value obtained by dividing an absolute value of a difference between the first threshold voltage and the second threshold voltage by the second threshold voltage is not more than 0.08 V. The second threshold voltage is not less than 2.5 V. The silicon carbide semiconductor device capable of achieving reduced variation in threshold voltage can thereby be provided. In addition, the threshold voltage itself can be increased.

(3) In silicon carbide semiconductor device 1 according to (1) or (2) described above, the off direction may be either a direction within 5° in the {0001} plane relative to a <1-100> direction, or a direction within 5° in the {0001} plane relative to a <11-20> direction.

(4) In silicon carbide semiconductor device 1 according to (1) or (2) described above, the side surface may include a {03-38} plane. Channel mobility can thereby be improved.

(5) Silicon carbide semiconductor device 1 according to any one of (1) to (4) described above may further include a gate pad 3 connected to gate electrode 27 and facing first main surface 10a. Gate insulating film 15 may include an insulating film portion 15b provided between first main surface 10a and gate pad 3. Gate electrode 27 may include an electrode portion 27b provided on insulating film portion 15b. Where an interface between insulating film portion 15b and electrode portion 27b is defined as a first interface 15b1, and a region of an interface between insulating film portion 15b and silicon carbide substrate 10 that faces first interface 15b1 is defined as a second interface 15b2, a value obtained by dividing a total number of sodium contained in an interface region R, which lies between a first virtual surface 2a distant from first interface 15b1 toward electrode portion 27b by a thickness of insulating film portion 15b along a normal direction of first interface 15b1 and a second virtual surface 2b distant from second interface 15b2 toward silicon carbide substrate 10 by the thickness of insulating film portion 15b along a normal direction of second interface 15b2, by an area of first interface 15b1 may be not more than $5 \times 10^{10}$ atoms/cm$^2$.

Details of Embodiment

The embodiment will be described below based on the drawings. It is noted that the same or corresponding parts are designated by the same reference numbers in the following drawings, and description thereof will not be repeated. Regarding crystallographic indications in the present specification, an individual orientation is represented by [ ], a group orientation is represented by < >, an individual plane is represented by ( ), and a group plane is represented by { }. In addition, a negative crystallographic index is normally expressed by putting "-" (bar) above a numeral, but is expressed by putting a negative sign before the numeral in the present specification.

First, a description will be given of the configuration of a MOSFET as an example of a silicon carbide semiconductor device according to the present embodiment.

As shown in FIG. 1, a MOSFET 1 according to the present embodiment mainly has a silicon carbide substrate 10, a gate insulating film 15, a gate electrode 27, a gate pad 3, an interlayer insulating film 22, an insulating film 4, a source electrode 16, a source interconnect 19, and a drain electrode 20. Silicon carbide substrate 10 includes a silicon carbide single-crystal substrate 11 and a silicon carbide epitaxial layer 24. Silicon carbide substrate 10 has a first main surface 10a and a second main surface 10b opposite to first main surface 10a. Silicon carbide epitaxial layer 24 forms first main surface 10a, and silicon carbide single-crystal substrate 11 forms second main surface 10b. Silicon carbide single-crystal substrate 11 is hexagonal silicon carbide having a polytype of 4H, for example. Silicon carbide single-crystal substrate 11 includes an impurity such as nitrogen (N), and has n type conductivity (first conductivity type). Silicon carbide epitaxial layer 24 mainly has a drift region 12 (first impurity region 12), a body region 13 (second impurity region 13), a source region 14 (third impurity region 14), and a p+ region 18.

Drift region 12 includes an n type impurity such as nitrogen, and has n type conductivity. The concentration of the n type impurity included in drift region 12 is not less than $1 \times 10^{15}$ cm$^{-3}$ and not more than $5 \times 10^{16}$ cm$^{-3}$, for example. The concentration of the n type impurity included in drift region 12 may be lower than the concentration of the n type impurity included in silicon carbide single-crystal substrate 11.

Body region 13 is provided on drift region 12. Body region 13 includes a p type impurity such as aluminum (Al), and has p type conductivity (second conductivity type). The concentration of the p type impurity included in body region 13 is not less than $1 \times 10^{17}$ cm$^{-3}$ and not more than $5 \times 10^{18}$ cm$^{-3}$, for example. The concentration of the p type impurity included in body region 13 may be higher than the concentration of the n type impurity included in drift region 12.

Source region 14 is provided on body region 13 so as to be spaced from drift region 12 by body region 13. Source region 14 includes an n type impurity such as nitrogen (N) or phosphorus (P), and has n type conductivity. Source region 14 may form first main surface 10a. The concentration of the n type impurity included in source region 14 may be higher than the concentration of the n type impurity included in drift region 12.

P+ region 18 includes a p type impurity such as aluminum (Al), and has p type conductivity. The concentration of the p type impurity included in p+ region 18 may be higher than the concentration of the p type impurity included in body region 13. P+ region 18 has a contact region 18a and a high-concentration p type region 18b. Contact region 18a is in contact with source electrode 16 and body region 13. Contact region 18a penetrates source region 14. High-concentration p type region 18b is in contact with a second insulating film portion 15b, body region 13, and source region 14.

MOSFET 1 is formed of an active region, and an outer peripheral region surrounding the active region in plan view (field of view seen along a direction perpendicular to second main surface 10b of silicon carbide substrate 10). The outer peripheral region is a region having a voltage-withstanding structure such as a guard ring or a field stop. High-concentration p type region 18b is provided in the outer peripheral region. Contact region 18a is provided in the active region. Contact region 18a may be partially provided in the outer peripheral region.

First main surface 10a is provided with a trench TR. Trench TR is defined by a side surface SW, and a bottom BT provided continuously with side surface SW. Side surface SW penetrates source region 14 and body region 13 to reach drift region 12. Bottom BT is located in drift region 12. Body region 13 includes a channel region CH in contact with gate insulating film 15. Channel region CH is a region configured such that a current flows therethrough in an on state. An angle θ1 formed between first main surface 10a and side surface SW is not less than 95° and not more than 130°, for example. Side surface SW may be, for example, a plane inclined not less than 50° and not more than 70° relative to a {0001} plane, or a plane inclined not less than 50° and not more than 70° relative to a (000-1) plane. Bottom BT may be a face substantially parallel to first main surface 10a. Trench TR may be V-shaped in cross-sectional view (field of view seen from a direction parallel to second main surface 10b).

Figure 2:
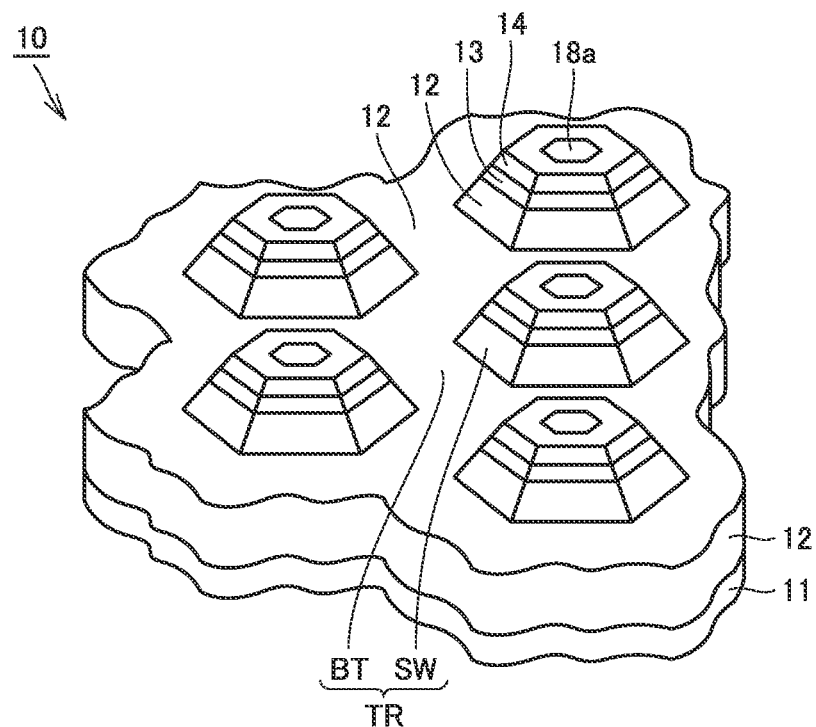
FIG. 2 is a schematic perspective view showing the shape of a silicon carbide substrate in an active region.

FIG. 2 is a schematic perspective view showing only the active region of silicon carbide substrate 10 removed from MOSFET 1 of FIG. 1. As shown in FIG. 2, source region 14 and body region 13 are exposed at side surface SW. Drift region 12 is exposed at each of side surface SW and bottom BT. A portion where bottom BT and side surface SW are connected together forms a corner portion of trench TR. In plan view, trench TR may extend to form a mesh having a honeycomb structure. In plan view, first main surface 10a of silicon carbide substrate 10 formed of source region 14 and contact region 18a has a polygonal shape, preferably a hexagonal shape. In plan view, each of body region 13, source region 14 and contact region 18a has a hexagonal outer shape.

As shown in FIG. 1, gate insulating film 15 includes a first insulating film portion 15a in contact with bottom BT and side surface SW, and second insulating film portion 15b in contact with first main surface 10a. Gate insulating film 15 is made of a material including silicon dioxide, for example. First insulating film portion 15a may be in contact with drift region 12 at bottom BT, and may be in contact with each of source region 14, body region 13 and drift region 12 at side surface SW. First insulating film portion 15a is provided in the active region and the outer peripheral region, for example. Second insulating film portion 15b is provided in the outer peripheral region, for example. Second insulating film portion 15b may be in contact with source region 14 and high-concentration p type region 18b at first main surface 10a. In cross-sectional view, the thickness of first insulating film portion 15a at each corner portion in the direction perpendicular to second main surface 10b may be greater than the thickness of first insulating film portion 15a at a position midway between the corner portions in the direction perpendicular to second main surface 10b.

Gate electrode 27 is provided on gate insulating film 15. Gate electrode 27 includes a first electrode portion 27a provided on first insulating film portion 15a, and a second electrode portion 27b provided on second insulating film portion 15b. Gate electrode 27 is made of polysilicon including an impurity, for example. First electrode portion 27a is provided in the active region and the outer peripheral region, for example. Second electrode portion 27b is provided in the outer peripheral region, for example.

Source electrode 16 is provided on first main surface 10a. Source electrode 16 is in contact with source region 14 and contact region 18a, for example. Source electrode 16 is made of a material including Ti, Al and Si, for example. Source electrode 16 is in ohmic contact with source region 14. Source electrode 16 is in ohmic contact with contact region 18a.

Drain electrode 20 is in contact with silicon carbide single-crystal substrate 11 at second main surface 10b. Drain electrode 20 is electrically connected to drift region 12. Drain electrode 20 is made of a material including NiSi or TiAlSi, for example. Drain electrode 20 is provided in the active region and the outer peripheral region, for example.

Interlayer insulating film 22 is provided in contact with gate electrode 27 and gate insulating film 15. Interlayer insulating film 22 is made of a material including silicon dioxide, for example. Interlayer insulating film 22 electrically isolates gate electrode 27 and source electrode 16 from each other. Interlayer insulating film 22 may be partially provided in trench TR. Insulating film 4 is provided on second electrode portion 27b. Insulating film 4 is made of a material including silicon dioxide, for example. Insulating film 4 is provided in the outer peripheral region. Source interconnect 19 is in contact with source electrode 16. Source interconnect 19 is made of a material including aluminum, for example. Source interconnect 19 is provided to cover interlayer insulating film 22.

Gate pad 3 is connected to gate electrode 27. Gate pad 3 is configured to be able to apply a gate voltage to gate electrode 27. Gate pad 3 is provided on insulating film 4. Gate pad 3 faces first main surface 10a. Second insulating film portion 15b is provided between first main surface 10a and gate pad 3. Second electrode portion 27b lies between second insulating film portion 15b and insulating film 4. Gate pad 3 is in contact with a side surface of insulating film 4 and a side surface of interlayer insulating film 22, and is connected to second electrode portion 27b. Gate pad 3 is made of a material including aluminum, for example. Gate pad 3 is provided in the outer peripheral region.

Next, a total number of sodium in an interface region will be described.

Figure 3:
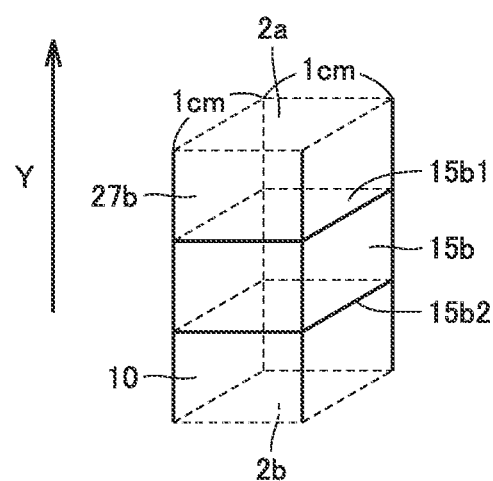
FIG. 3 is a diagram for illustrating the definition of a total number of sodium.

As shown in FIGS. 1 and 3, an interface between second insulating film portion 15b and second electrode portion 27b is defined as a first interface 15b1, and a region of an interface between second insulating film portion 15b and silicon carbide substrate 10 that faces first interface 15b1 is defined as a second interface 15b2. A region lying between a first virtual surface 2a distant from first interface 15b1 toward second electrode portion 27b by a thickness a of second insulating film portion 15b along a normal direction Y of first interface 15b1 and a second virtual surface 2b distant from second interface 15b2 toward silicon carbide substrate 10 by thickness a of second insulating film portion 15b along normal direction Y of second interface 15b2 is defined as an interface region R. A value obtained by dividing the total number of sodium contained in interface region R by the area of first interface 15b1 is preferably not more than $5 \times 10^{10}$ atoms/cm$^2$, more preferably not more than $3 \times 10^{10}$ atoms/cm$^2$, and further preferably not more than $1 \times 10^{10}$ atoms/cm$^2$.

As shown in FIG. 3, the value obtained by dividing the total number of sodium contained in interface region R by the area of first interface 15b1 represents the number of sodium atoms in interface region R per unit area (1 cm$^2$) of first interface 15b1. In other words, the value obtained by dividing the total number of sodium contained in interface region R by the area of first interface 15b1 represents the total number of sodium atoms contained in a rectangular parallelepiped shown in FIG. 3. The total number of sodium can be counted with a SIMS (Secondary Ion-microprobe Mass Spectrometer).

Figure 4:
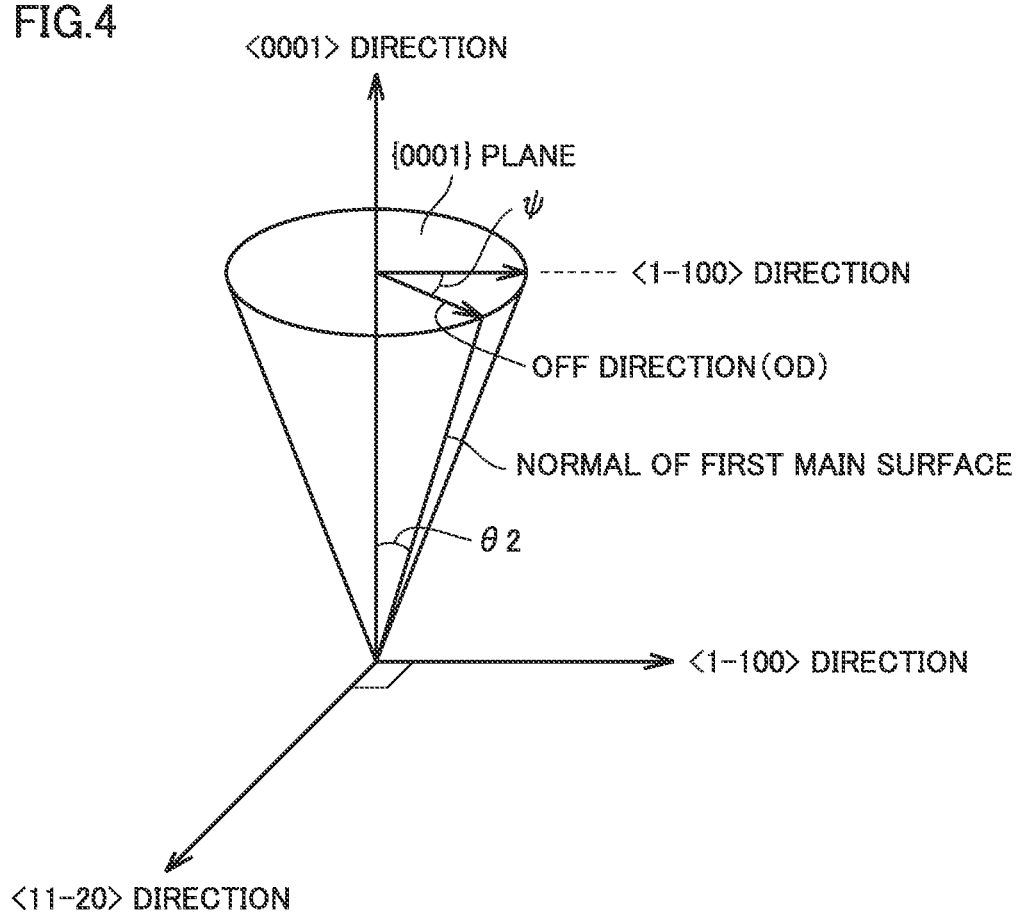
FIG. 4 is a diagram for illustrating an off direction of a first main surface.

First main surface 10a is a {0001} plane, or a plane inclined at an angle of not more than 8° in an off direction relative to the {0001} plane. Preferably, first main surface 10a is a (000-1) plane, or a plane inclined at an angle of not more than 8° in an off direction relative to the (000-1) plane. In short, first main surface 10a has an off angle of not more than 8°. As shown in FIG. 4, if first main surface 10a is a plane inclined at an off angle θ2 in an off direction OD relative to the {0001} plane, then an angle formed between the normal of first main surface 10a and a <0001> direction is off angle θ2. The off direction may be a <1-100> direction or a <11-20> direction. As shown in FIG. 4, the off direction may be a direction within an azimuth angle in the {0001} plane relative to the <1-100> direction. Azimuth angle is 5°, for example. In other words, the off direction may be a direction within 5° in the {0001} plane relative to the <1-100> direction. The off direction may be any one of directions within 5° in the {0001} plane relative to the <11-20> direction. Side surface SW may include a {03-38} plane.

Next, the definition of a threshold voltage ($V_{th}$) of the silicon carbide semiconductor device will be described.

Figure 5:
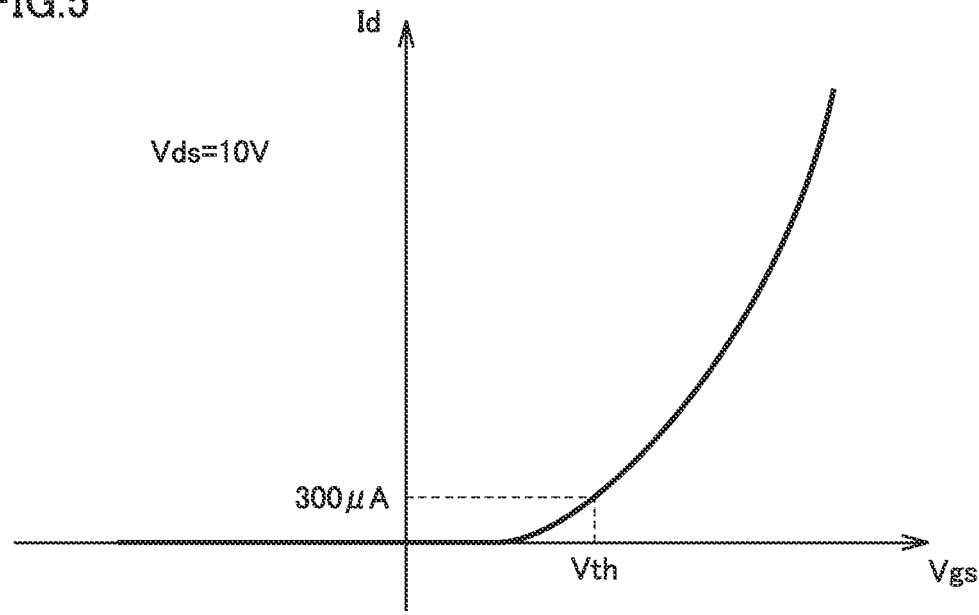
FIG. 5 is a diagram for illustrating the definition of a threshold voltage of a silicon carbide semiconductor device.

First, a drain current (that is, a source-drain current $I_d$) is measured with a gate voltage (that is, a gate-source voltage $V_{gs}$) being varied. When the gate voltage is lower than the threshold voltage, a pn junction between body region 13 and drift region 12 located directly under gate insulating film 15 is reverse-biased and in a non-conducting state (off state). Therefore, substantially no drain current flows between source electrode 16 and drain electrode 20. When a voltage higher than or equal to the threshold voltage is applied to gate electrode 27, on the other hand, an inversion layer is formed in channel region CH in the vicinity of a portion of contact of body region 13 with gate insulating film 15. Consequently, source region 14 and drift region 12 are electrically connected to each other, causing a drain current to start to flow between source electrode 16 and drain electrode 20. Namely, the threshold voltage refers to a gate voltage at which a drain current starts to flow. More specifically, as shown in FIG. 5, the threshold voltage refers to a gate voltage at which a drain current attains to 300 µA when a source-drain voltage ($V_{ds}$) is 10 V. The threshold voltage is measured at room temperature. A drain current density during the measurement of the threshold voltage is 5 mA/cm², for example.

Next, the amount of variation and the rate of variation in threshold voltage of the silicon carbide semiconductor device will be described.

Figure 6:
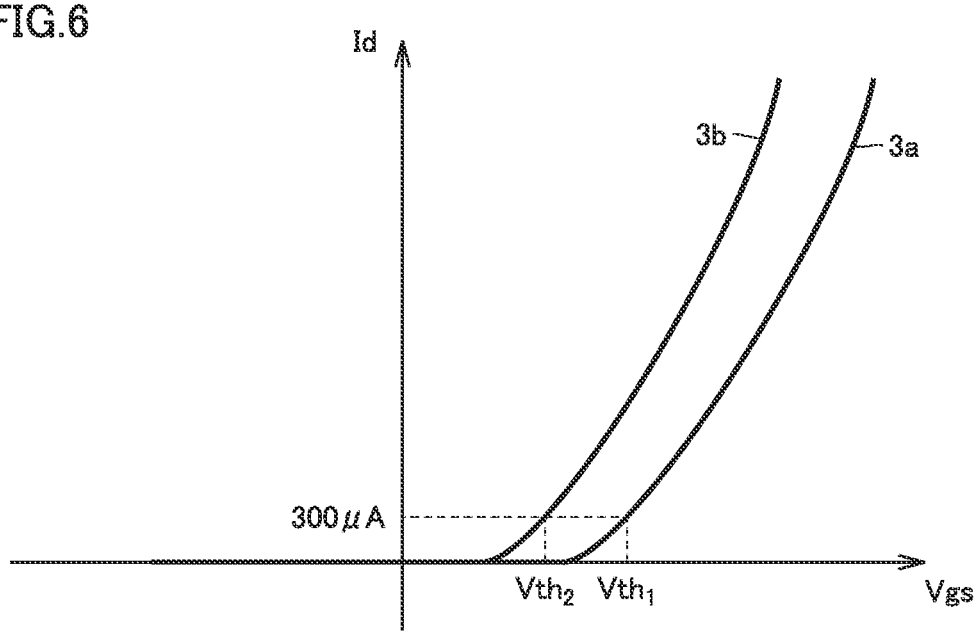
FIG. 6 is a diagram for illustrating a first threshold voltage and a second threshold voltage.

As shown in FIG. 6, the drain current is measured with the gate voltage applied to the silicon carbide semiconductor device being varied, and relation 3a between the gate voltage and the drain current is plotted. The gate voltage is represented on the x axis, and the drain current is represented on the y axis. The gate voltage at which the drain current attains to 300 µA when the source-drain voltage is 10 V is defined as a first threshold voltage ($V_{th1}$). Then, a stress test is conducted in which a positive voltage or negative voltage is applied to gate electrode 27 of the silicon carbide semiconductor device for a certain period of time. Specifically, a potential difference of gate electrode 27 relative to source electrode 16 is held at either a positive voltage (+20 V) or a negative voltage (−10 V), with source electrode 16 and drain electrode 20 being set at the same potential. Thereafter, the drain current is measured with the gate voltage applied to the silicon carbide semiconductor device being varied, and relation 3b between the gate voltage and the drain current is plotted. The gate voltage at which the drain current attains to 300 µA when the source-drain voltage is 10 V is defined as a second threshold voltage ($V_{th2}$). As shown in FIG. 6, the threshold voltage may vary after the stress test. In particular, when the threshold voltage varies to the negative side, switching operation which should be normally off operation may be turned on.

In accordance with MOSFET 1 according to the present embodiment, in a stress test in which a gate voltage of at least one of −10 V and 20 V is applied to gate electrode 27 for 100 hours at a temperature of 175° C., where a threshold voltage before the stress test is defined as the first threshold voltage and a threshold voltage after the stress test is defined as the second threshold voltage, an absolute value of a difference between the first threshold voltage and the second threshold voltage (in other words, the amount of variation in threshold voltage) is not more than 0.25 V. The amount of variation in threshold voltage is preferably not more than 0.2 V, and more preferably not more than 0.15 V. The second threshold voltage is not less than 2.5 V. The second threshold voltage is preferably is not less than 2.7 V, and more preferably not less than 2.9 V. The second threshold voltage may be higher or lower than the first threshold voltage.

In other words, in the stress test in which a gate voltage of −10 V is applied to gate electrode 27 for 100 hours at a temperature of 175° C., the absolute value of the difference between the first threshold voltage and the second threshold voltage may be not more than 0.25 V, and the second threshold voltage may be not less than 2.5 V, whereas in the stress test in which a gate voltage of 20 V is applied to gate electrode 27 for 100 hours at a temperature of 175° C., the absolute value of the difference between the first threshold voltage and the second threshold voltage may be more than 0.25 V, and the second threshold voltage may be less than 2.5 V.

Conversely, in the stress test in which a gate voltage of −10 V is applied to gate electrode 27 for 100 hours at a temperature of 175° C., the absolute value of the difference between the first threshold voltage and the second threshold voltage may be more than 0.25 V, and the second threshold voltage may be less than 2.5 V, whereas in the stress test in which a gate voltage of 20 V is applied to gate electrode 27 for 100 hours at a temperature of 175° C., the absolute value of the difference between the first threshold voltage and the second threshold voltage may be not more than 0.25 V, and the second threshold voltage may be not less than 2.5 V.

Preferably, in the stress test in which a gate voltage of −10 V is applied to gate electrode 27 for 100 hours at a temperature of 175° C., the absolute value of the difference between the first threshold voltage and the second threshold voltage is not more than 0.25 V, and the second threshold voltage is not less than 2.5 V, and in the stress test in which a gate voltage of 20 V is applied to gate electrode 27 for 100 hours at a temperature of 175° C., the absolute value of the difference between the first threshold voltage and the second threshold voltage is not more than 0.25 V, and the second threshold voltage is not less than 2.5 V.

In accordance with MOSFET 1 according to the present embodiment, in the stress test in which a gate voltage of at least one of −10 V and 20 V is applied to the gate electrode for 100 hours at a temperature of 175° C., where a threshold voltage before the stress test is defined as the first threshold voltage and a threshold voltage after the stress test is defined as the second threshold voltage, a value obtained by dividing an absolute value of a difference between the first threshold voltage and the second threshold voltage by the second threshold voltage (in other words, the rate of variation in threshold voltage) is not more than 0.08 (that is, 8%). The rate of variation in threshold voltage is preferably not more than 0.07 (that is, 7%), and more preferably not more than 0.05 (that is, 5%).

As described above, either in the stress test in which a gate voltage of −10 V is applied to gate electrode 27 for 100 hours, or in the stress test in which a gate voltage of 20 V is applied to gate electrode 27 for 100 hours, the amount of variation in threshold voltage may be more than 8%.

Preferably, in the stress test in which a gate voltage of −10 V is applied to gate electrode 27 for 100 hours at a temperature of 175° C., the rate of variation in threshold voltage is not more than 8%, and in the stress test in which a gate voltage of 20 V is applied to gate electrode 27 for 100 hours at a temperature of 175° C., the rate of variation in threshold voltage is not more than 8%.

Next, a method of manufacturing MOSFET 1 according to the embodiment will be described.

Figure 7:
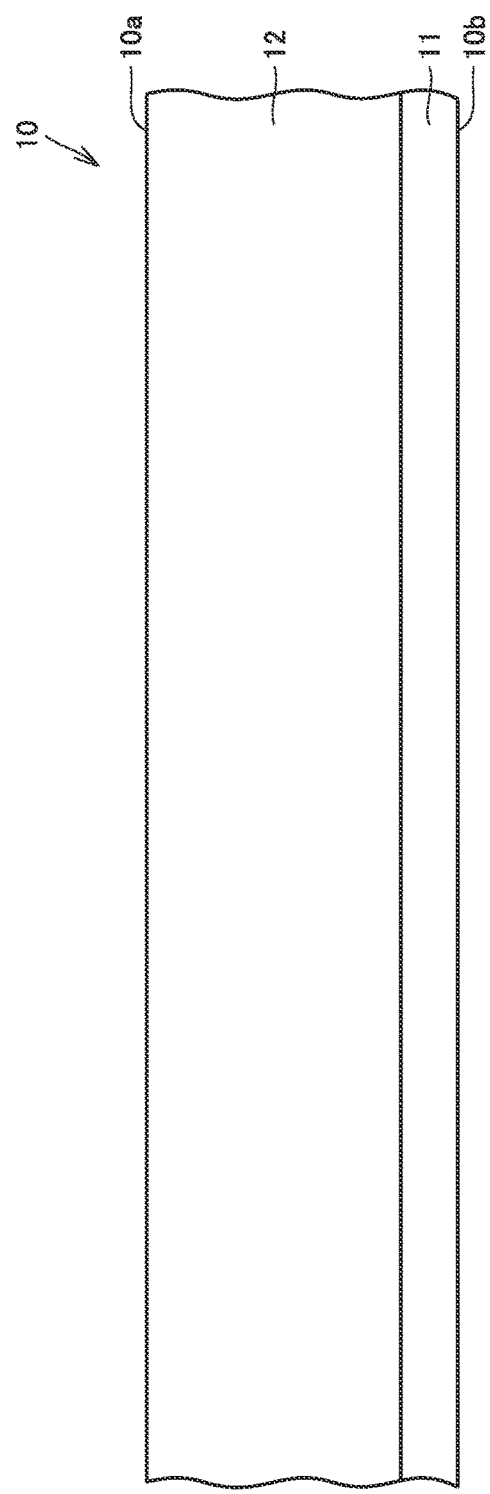
FIG. 7 is a schematic cross-sectional view showing a first step of a method of manufacturing the silicon carbide semiconductor device according to the embodiment.

First, a step of preparing a silicon carbide substrate is performed. As shown in FIG. 7, a silicon carbide epitaxial layer 12 is formed on silicon carbide single-crystal substrate 11. Specifically, silicon carbide epitaxial layer 12 is formed on silicon carbide single-crystal substrate 11 by CVD (Chemical Vapor Deposition) using a mixed gas of silane ($SiH_4$) and propane ($C_3H_8$) as a source material gas, for example, and hydrogen gas ($H_2$) as a carrier gas, for example. During the epitaxial growth, an n type impurity such as nitrogen (N) or phosphorus (P) is introduced as an impurity. Silicon carbide epitaxial layer 12 has n type conductivity. Silicon carbide substrate 10 has first main surface 10a forming silicon carbide epitaxial layer 12, and second main surface 10b located opposite to first main surface 10a and forming silicon carbide single-crystal substrate 11. First main surface 10a is a {0001} plane, and preferably a (000-1) plane. First main surface 10a may be a plane angled off by not more than 8° relative to the (000-1) plane.

Figure 8:
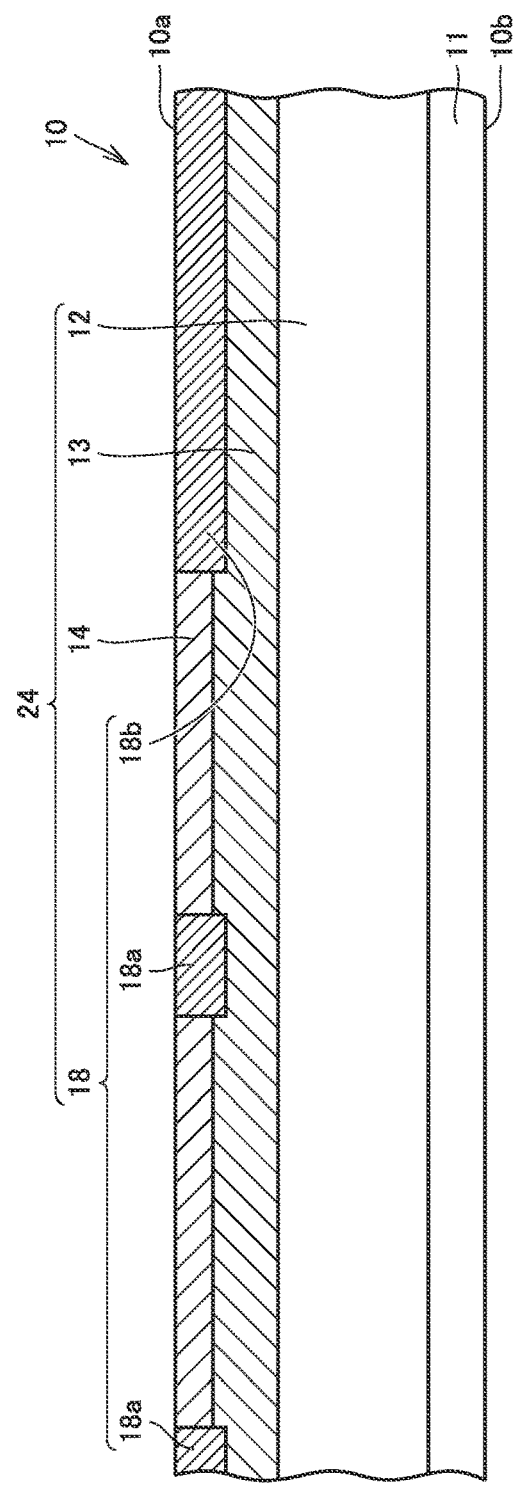
FIG. 8 is a schematic cross-sectional view showing a second step of the method of manufacturing the silicon carbide semiconductor device according to the embodiment.

Then, ions of a p type impurity such as aluminum are implanted into first main surface 10a, to form body region 13. Then, ions of an n type impurity such as phosphorus are implanted into body region 13 to a depth smaller than that of body region 13, to form source region 14. Then, ions of a p type impurity such as aluminum are implanted into source region 14, to form p+ region 18 (see FIG. 8). P+ region 18 is formed to penetrate source region 14 and make contact with body region 13. P+ region 18 includes contact region 18a, and high-concentration p type region 18b provided closer to the outer periphery than contact region 18a.

Then, activation annealing is performed for activating the ion-implanted impurities in silicon carbide substrate 10. A temperature of the activation annealing is preferably not less than 1500° C. and not more than 1900° C., and is about 1700° C., for example. A period of time of the activation annealing is about 30 minutes, for example. An atmosphere of the activation annealing is preferably an inert gas atmosphere, and is an Ar atmosphere, for example.

Then, a step of forming a trench is performed. First, a mask layer (not shown) having an opening is formed on first main surface 10a. A silicon oxide film can be used, for example, as the mask layer. The opening is formed at a position corresponding to the position of trench TR (FIG. 1). Then, source region 14, body region 13, and a portion of drift region 12 are removed by etching in the opening of the mask layer. For example, reactive ion etching, in particular, inductive coupling plasma reactive ion etching, can be used as a method for the etching. Specifically, inductive coupling plasma reactive ion etching using $SF_6$ or a mixed gas of $SF_6$ and $O_2$ as a reactive gas can be used, for example. As a result of the etching, a recess having a side substantially perpendicular to first main surface 10a and a bottom continuous with the side and substantially parallel to first main surface 10a is formed in a region where trench TR (FIG. 1) is to be formed.

Then, thermal etching is performed in the recess. The thermal etching may be performed, for example, by means of heating in an atmosphere including a reactive gas having at least one or more types of halogen atoms. The at least one or more types of halogen atoms include at least one of chlorine (Cl) atoms and fluorine (F) atoms. This atmosphere includes, for example, $Cl_2$, $BCL_3$, $SF_6$ or $CF_4$. The thermal etching is performed using a mixed gas of chlorine gas and oxygen gas as a reactive gas, for example, at a heat treatment temperature of not less than 700° C. and not more than 1000° C., for example. The reactive gas may include a carrier gas in addition to the chlorine gas and the oxygen gas described above. For example, nitrogen ($N_2$) gas, argon gas, or helium gas can be used as the carrier gas. After the thermal etching, the mask layer is removed from first main surface 10a using hydrofluoric acid (HF), for example.

Figure 9:
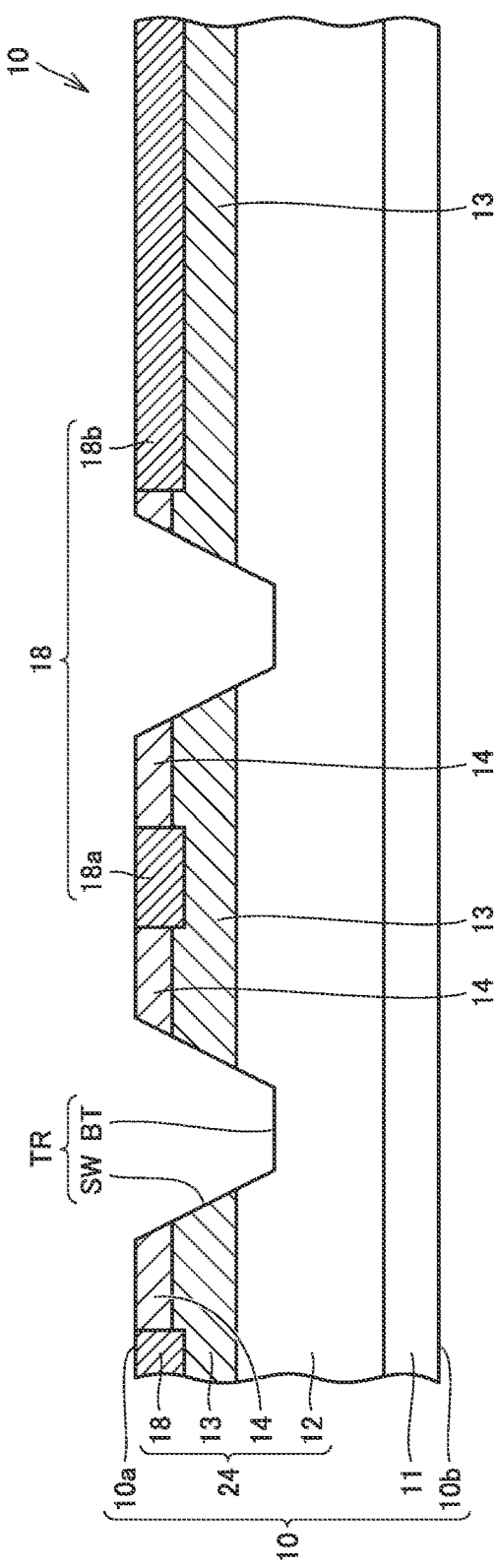
FIG. 9 is a schematic cross-sectional view showing a third step of the method of manufacturing the silicon carbide semiconductor device according to the embodiment.

As a result of the thermal etching described above, trench TR is formed in first main surface 10a (see FIG. 9). Trench TR is defined by side surface SW penetrating source region 14 and body region 13 to reach drift region 12, and bottom BT located in drift region 12.

Then, a step of forming a gate insulating film is performed. Silicon carbide substrate 10 is thermally oxidized to form gate insulating film 15 in contact with source region 14, body region 13, drift region 12 and p+ region 18. Specifically, silicon carbide substrate 10 is heated at a temperature of not less than 1300° C. and not more than 1400° C., for example, in an atmosphere including oxygen.

Gate insulating film 15 is thereby formed such that it is provided in trench TR and in contact with first main surface 10a. Gate insulating film 15 includes first insulating film portion 15a in contact with source region 14, body region 13 and contact region 18a at side surface SW, and second insulating film portion 15b in contact with high-concentration p type region 18b at first main surface 10a. First insulating film portion 15a and second insulating film portion 15b are formed simultaneously.

Then, silicon carbide substrate 10 may be subjected to heat treatment (NO annealing) in a nitrogen monoxide (NO) gas atmosphere. During the NO annealing, silicon carbide substrate 10 is held for about one hour under a condition of not less than 1100° C. and not more than 1300° C., for example. Nitrogen atoms are thereby introduced into an interface region between gate insulating film 15 and body region 13. As a result, the formation of an interface state in the interface region can be suppressed to thereby improve channel mobility. If such introduction of nitrogen atoms is possible, gas other than the NO gas (for example, $N_2O$) may be used as an atmospheric gas. After the NO annealing, Ar annealing using argon (Ar) as an atmospheric gas may be further carried out. A heating temperature of the Ar annealing is higher than or equal to the heating temperature of the NO annealing described above, for example. A period of time of the Ar annealing is about one hour, for example. The formation of an interface state in the interface region between gate insulating film 15 and body region 13 is thereby further suppressed. Instead of the Ar gas, another inert gas such as nitrogen gas may be used as an atmospheric gas.

Figure 10:
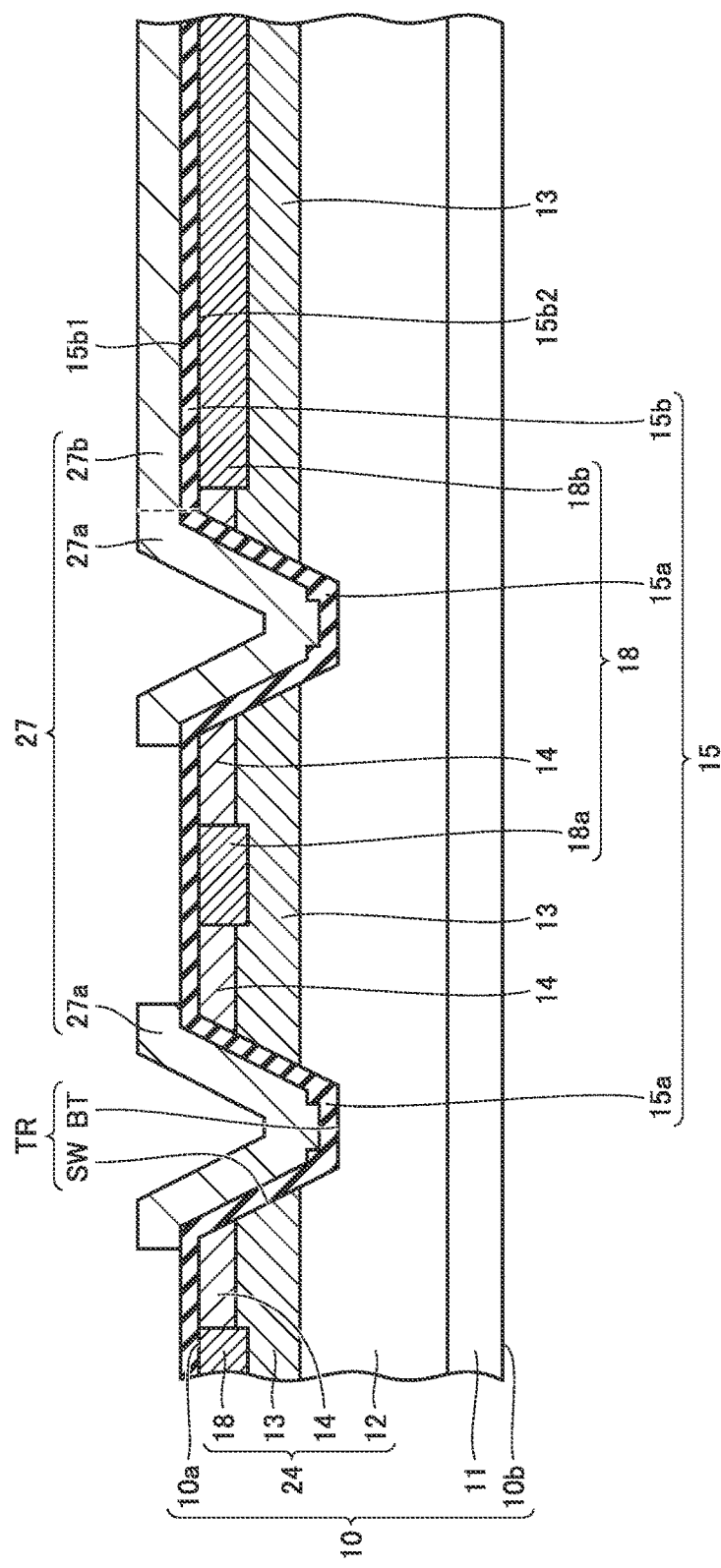
FIG. 10 is a schematic cross-sectional view showing a fourth step of the method of manufacturing the silicon carbide semiconductor device according to the embodiment.

Then, a step of forming a gate electrode is performed. As shown in FIG. 10, gate electrode 27 is formed on gate insulating film 15. Gate electrode 27 is formed by LPCVD (Low Pressure Chemical Vapor Deposition), for example. Gate electrode 27 includes first electrode portion 27a provided on first insulating film portion 15a, and second electrode portion 27b provided on second insulating film portion 15b. Second electrode portion 27b is provided to face first main surface 10a. First electrode portion 27a and second electrode portion 27b are formed simultaneously.

Then, interlayer insulating film 22 is formed. Specifically, interlayer insulating film 22 is formed to cover gate electrode 27 and to make contact with gate insulating film 15. Interlayer insulating film 22 is formed by chemical vapor deposition, for example. Interlayer insulating film 22 is a material including silicon dioxide, for example. Preferably, interlayer insulating film 22 is formed on gate electrode 27 such that a shortest distance W (see FIG. 1) between a position A where the boundary between source region 14 and body region 13 is in contact with side surface SW of trench TR and a surface 22a of interlayer insulating film 22 is not less than 1.2 µm in cross-sectional view. The introduction of Na from outside into gate insulating film 15 facing body region 13 can thereby be suppressed effectively. Preferably, in all cell regions in the wafer plane, shortest distance W is not less than 1.2 µm. More preferably, shortest distance W is not less than 1.3 µm.

Then, a step of forming a source electrode is performed. Specifically, etching is performed to form an opening in interlayer insulating film 22 and gate insulating film 15, to expose source region 14 and contact region 18a at interlayer insulating film 22 and gate insulating film 15 in this opening. Then, source electrode 16 is formed in contact with source region 14 and contact region 18a at first main surface 10a.

Source electrode 16 is formed by sputtering, for example. Source electrode 16 is made of a material including Ti, Al and Si, for example.

Figure 11:
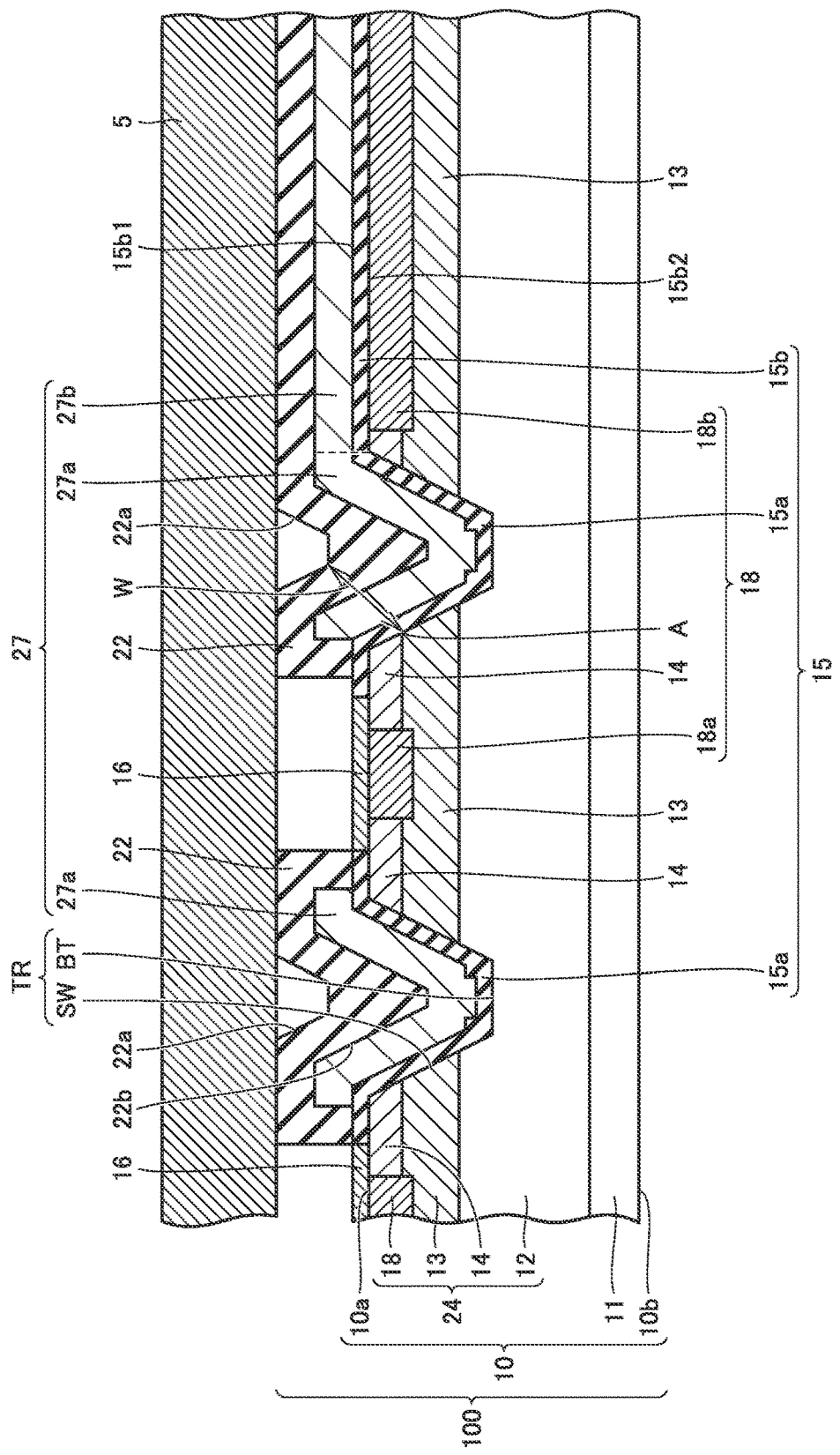
FIG. 11 is a schematic cross-sectional view showing a fifth step of the method of manufacturing the silicon carbide semiconductor device according to the embodiment.

Then, a lid 5 made of a material including silicon is formed on interlayer insulating film 22 (see FIG. 11). Lid 5 is a silicon substrate, for example. The thickness of lid 5 in the direction perpendicular to second main surface 10b is not less than 500 µm, for example. Lid 5 is formed on interlayer insulating film 22 to make contact with a portion of surface 22a of interlayer insulating film 22 and to be spaced from source electrode 16. Lid 5 and interlayer insulating film 22 may be spaced from each other in a region facing bottom BT of trench TR. Here, silicon carbide substrate 10 having gate insulating film 15, gate electrode 27, source electrode 16 and interlayer insulating film 22 formed at the first main surface 10a side is referred to as an intermediate substrate 100. Intermediate substrate 100 has surface 22a and a backside surface 10b. Interlayer insulating film 22 forms surface 22a, and silicon carbide single-crystal substrate 11 forms backside surface 10b.

Figure 12:
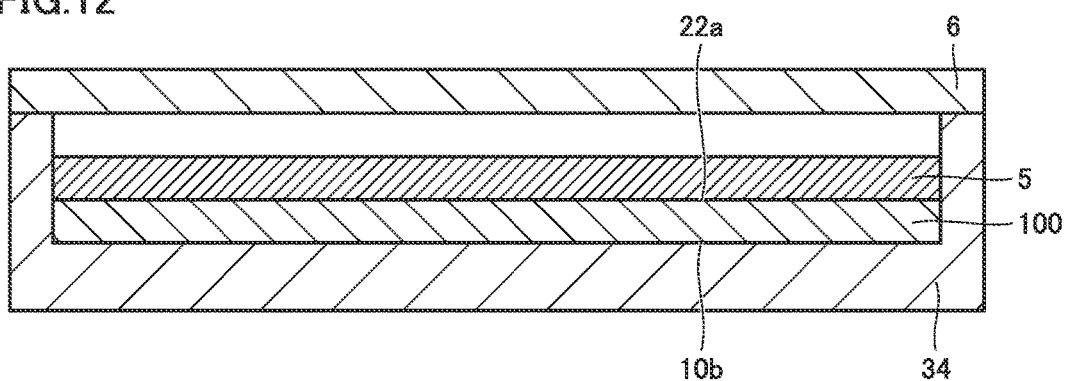
FIG. 12 is a schematic cross-sectional view showing a sixth step of the method of manufacturing the silicon carbide semiconductor device according to the embodiment.

Then, intermediate substrate 100 having lid 5 formed on surface 22a is disposed in a housing 34 made of carbon, for example. Then, a cover 6 made of carbon is disposed to cover an opening in housing 34. Consequently, intermediate substrate 100 and lid 5 are disposed in a space formed by housing 34 and cover 6 such that backside surface 10b of intermediate substrate 100 makes contact with the bottom of housing 34 and lid 5 faces cover 6 (see FIG. 12). Housing 34 and cover 6 are made of a material including graphite, for example.

Then, alloying annealing is performed. Specifically, source electrode 16 in contact with source region 14 and contact region 18a is held for about 5 minutes at a temperature of not less than 900° C. and not more than 1100° C., for example. At least a portion of source electrode 16 thereby reacts with the silicon contained in silicon carbide substrate 10 and is silicided. Source electrode 16 in ohmic contact with source region 14 is thereby formed. Preferably, source electrode 16 is in ohmic contact with contact region 18a.

The heat treatment in the alloying annealing step causes a metal impurity such as sodium to diffuse to the vicinity of gate insulating film 15, which is believed to cause variation in threshold voltage. It is thus believed that by performing the alloying annealing after lid 5 made of silicon has been provided on surface 22a of intermediate substrate 100, the diffusion of a metal impurity such as sodium to the vicinity of gate insulating film 15 can be suppressed. It is inferred that a heater for performing the alloying annealing is one of the sources that produce sodium.

In the case of a trench type MOSFET, source electrode 16 is provided at the (000-1) plane side, and in the case of a planar (without a gate trench) MOSFET, source electrode 16 is provided at the (0001) plane side. The (000-1) plane of silicon carbide is less likely to make ohmic contact with source electrode 16 than the (0001) plane of silicon carbide. Thus, the alloying annealing is performed for a longer period of time for a trench type MOSFET than for a planar MOSFET. It is thus desirable to use thicker lid 5 for a trench type MOSFET than for a planar MOSFET.

Figure 13:
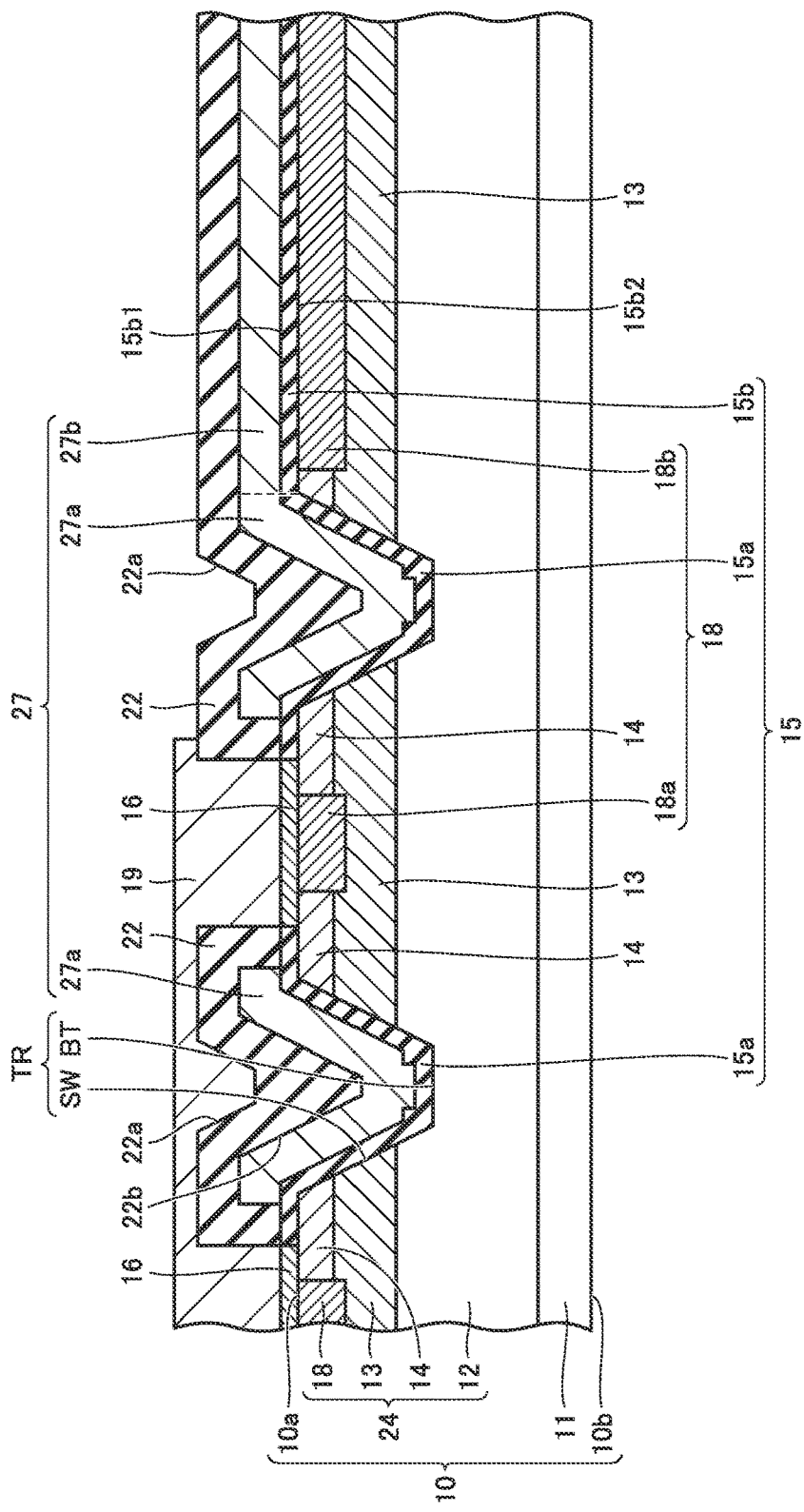
FIG. 13 is a schematic cross-sectional view showing a seventh step of the method of manufacturing the silicon carbide semiconductor device according to the embodiment.

Then, lid 5 is removed from surface 22a of interlayer insulating film 22. Then, source interconnect 19 is formed to be electrically connected to source electrode 16. Source interconnect 19 is formed on source electrode 16 and interlayer insulating film 22 (see FIG. 13). Then, gate pad 3 is formed on insulating film 4 to be in contact with second electrode portion 27b of gate electrode 27. Then, drain electrode 20 is formed in contact with second main surface 10b of silicon carbide substrate 10. MOSFET 1 according to the embodiment (FIG. 1) is thereby completed.

Although n type has been described as the first conductivity type and p type has been described as the second conductivity type in the above embodiment, p type may be the first conductivity type and n type may be the second conductivity type. Although a MOSFET has been described as an example of the silicon carbide semiconductor device in the above embodiment, the silicon carbide semiconductor device may be an IGBT (Insulated Gate Bipolar Transistor) or the like.

Next, a function and effect of the MOSFET according to the embodiment will be described.

In accordance with MOSFET 1 according to the present embodiment, in a stress test in which a gate voltage of at least one of −10 V and 20 V is applied to gate electrode 27 for 100 hours at a temperature of 175° C., where a threshold voltage before the stress test is defined as a first threshold voltage and a threshold voltage after the stress test is defined as a second threshold voltage, an absolute value of a difference between the first threshold voltage and the second threshold voltage is not more than 0.25 V. The second threshold voltage is not less than 2.5 V. The MOSFET capable of achieving reduced variation in threshold voltage can thereby be provided. In addition, the threshold voltage itself can be increased.

In accordance with MOSFET 1 according to the present embodiment, in a stress test in which a gate voltage of at least one of −10 V and 20 V is applied to the gate electrode for 100 hours at a temperature of 175° C., where a threshold voltage before the stress test is defined as a first threshold voltage and a threshold voltage after the stress test is defined as a second threshold voltage, a value obtained by dividing an absolute value of a difference between the first threshold voltage and the second threshold voltage by the second threshold voltage is not more than 0.08. The second threshold voltage is not less than 2.5 V. The silicon carbide semiconductor device capable of achieving reduced variation in threshold voltage can thereby be provided. In addition, the threshold voltage itself can be increased.

In accordance with MOSFET 1 according to the present embodiment, the off direction may be either a direction within 5° in the {0001} plane relative to the <1-100> direction, or a direction within 5° in the {0001} plane relative to the <11-20> direction.

In accordance with MOSFET 1 according to the present embodiment, the side surface may include the {03-38} plane. The channel mobility can thereby be improved.

Further, MOSFET 1 according to the present embodiment may further include gate pad 3 connected to gate electrode 27 and facing first main surface 10a. Gate insulating film 15 may include second insulating film portion 15b provided between first main surface 10a and gate pad 3. Gate electrode 27 may include second electrode portion 27b provided on second insulating film portion 15b. Where the interface between second insulating film portion 15b and second electrode portion 27b is defined as first interface 15b1, and the region of the interface between second insulating film portion 15b and silicon carbide substrate 10 that faces first interface 15b1 is defined as second interface 15b2, a value obtained by dividing the total number of sodium contained in interface region R, which lies between first virtual surface 2a distant from first interface 15b1 toward second electrode portion 27b by the thickness of second insulating film portion 15b along the normal direction of first interface 15b1 and second virtual surface 2b distant from second interface 15b2 toward silicon carbide substrate 10 by the thickness of second insulating film portion 15b along the normal direction of second interface 15b2, by the area of first interface 15b1 may be not more than $5 \times 10^{10}$ atoms/cm$^2$.

EXAMPLES

1. Preparation of Samples

First, MOSFETs 1 according to sample 1 to sample 3 are fabricated with a method similar to the method described in the above embodiment except for the following conditions. As shown in Table 1, in a step of forming interlayer insulating film 22 of sample 1, interlayer insulating film 22 is formed such that shortest distance W (see FIG. 1) is 1.3 μm. In a step of forming interlayer insulating film 22 of each of samples 2 and 3, interlayer insulating film 22 is formed such that shortest distance W (see FIG. 1) is 1.0 μm. In manufacturing processes of samples 1 and 2, lid 5 made of silicon is disposed on surface 22a of interlayer insulating film 22 (see FIG. 11). Then, intermediate substrate 100 having lid 5 disposed on surface 22a is disposed in housing 34. Cover 6 is disposed on housing 34 (see FIG. 12). In a manufacturing process of sample 3, intermediate substrate 100 is disposed in housing 34, without lid 5 made of silicon being disposed on surface 22a of interlayer insulating film 22, and cover 6 is disposed on housing 34. Then, alloying annealing is performed on samples 1 to 3.

TABLE 1

| | Shortest distance W [μm] | Si lid |
|---|---|---|
| Sample 1 | 1.3 | With Si lid |
| Sample 2 | 1.0 | With Si lid |
| Sample 3 | 1.0 | Without Si lid |

Figure 14:
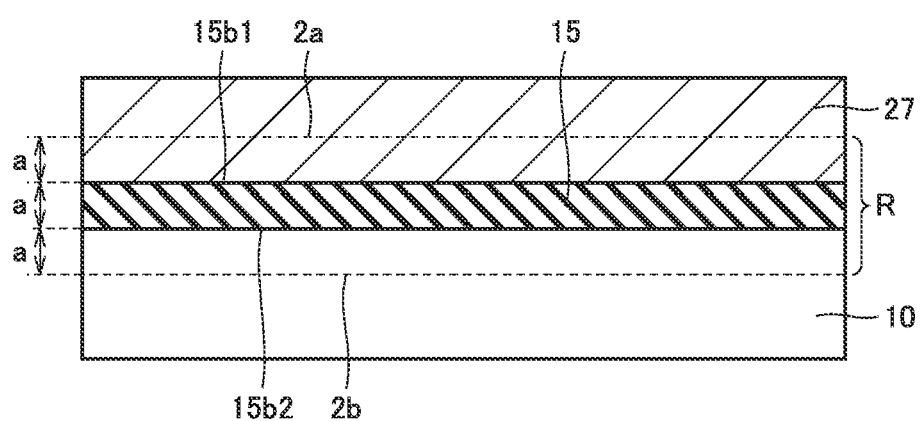
FIG. 14 is a schematic cross-sectional view showing the configuration of a TEG (Test Element Group) for measuring a total number of sodium.

A TEG shown in FIG. 14 is formed on the same wafer as the wafers on which MOSFETs 1 according to sample 1 to sample 3 are formed. This TEG is fabricated to measure the total number of sodium in interface region R. As shown in FIG. 14, a silicon dioxide film 15 is provided on silicon carbide substrate 10, and a polysilicon 27 is provided on silicon dioxide film 15. Silicon dioxide film 15 corresponds to gate insulating film 15, and polysilicon 27 corresponds to gate electrode 27. Gate insulating film 15 has a thickness of 45 nm. Polysilicon 27 has a thickness of 300 nm.

2. Experiments

Amounts of variation in threshold voltage of MOSFETs 1 according to sample 1 to sample 3 are measured. Specifically, first, a first threshold voltage before the application of gate bias stress to gate electrode 27 of MOSFET 1 according to each of sample 1 to sample 3 is measured. Then, gate bias stress is applied to MOSFETs 1 according to sample 1 to sample 3.

In an experiment A, as the gate bias stress, a gate voltage of +20 V is applied to gate electrode 27 for 100 hours at a temperature of 175° C. After the application of the gate bias stress, a second threshold voltage is measured. The amount of variation in threshold voltage is calculated by subtracting the first threshold voltage from the second threshold voltage. The rate of variation in threshold voltage is calculated by dividing the amount of variation by the second threshold voltage.

In an experiment B, a first threshold voltage before the application of gate bias stress to gate electrode 27 of MOSFET 1 according to each of sample 1 to sample 3 is measured. Then, a gate voltage of −10 V is applied to gate electrode 27 for 100 hours at a temperature of 175° C. After the application of the gate bias stress, a second threshold voltage is measured. The amount of variation in threshold voltage is calculated by subtracting the first threshold voltage from the second threshold voltage. The rate of variation in threshold voltage is calculated by dividing the amount of variation by the second threshold voltage.

The first and second threshold voltages are measured at room temperature. During the measurement of the threshold voltages, source-drain voltage Vds is 10 V, and the drain current density is 5 mA/cm$^2$.

In addition, a sodium concentration is measured using a TEG formed under the same conditions as those for the MOSFETs according to sample 1 to sample 3. The sodium concentration is measured with a SIMS while the TEG is dug from the surface of polysilicon 27 toward silicon carbide substrate 10. The sodium concentration is integrated from first virtual surface 2a distant from first interface 15b1 between polysilicon 27 and silicon dioxide film 15 toward the surface of polysilicon 27 by the thickness of silicon dioxide film 15 (45 nm), to second virtual surface 2b distant from second interface 15b2 between silicon dioxide film 15 and silicon carbide substrate 10 toward silicon carbide substrate 10 by the thickness of silicon dioxide film 15 (45 nm), to thereby calculate the total amount of Na. The total amount of sodium atoms in interface region R is calculated by dividing the total amount of Na by the area of first interface 15b1.

3. Results

Next, relation between the total amount of Na, and the amount of variation in threshold voltage and the rate of variation in threshold voltage will be described. Table 2 shows the amounts of variation and the rates of variation in threshold voltage when the gate bias stress in experiment A (175° C., Vgs=+20 V, 100 hours) is applied. Table 3 shows the amounts of variation and the rates of variation in threshold voltage when the gate bias stress in experiment B (175° C., Vgs=−10 V, 100 hours) is applied.

TABLE 2

| Vgs = +20 V 175° C. | Total amount of Na [atom/cm$^2$] | First Vth [V] | Second Vth [V] | Amount of variation [V] | Rate of variation [%] |
|---|---|---|---|---|---|
| Sample 1 | $3.00 \times 10^9$ | 3.1 | 3.16 | 0.06 | 1.9 |
| Sample 2 | $1.40 \times 10^{10}$ | 3.11 | 3.21 | 0.1 | 3.1 |
| Sample 3 | $1.10 \times 10^{11}$ | 3.08 | 3.35 | 0.27 | 8.1 |

As shown in Table 2, after the application of the gate bias stress in experiment A (175° C., Vgs=+20 V, 100 hours), the second threshold voltages of the MOSFETs according to sample 1 to sample 3 are 3.16 V, 3.21 V and 3.35 V, respectively, which are all not less than 2.5 V. The absolute values of the amounts of variation in threshold voltage of the MOSFETs according to samples 1 and 2 are 0.06 V and 0.1 V, respectively, which are both not more than 0.25 V. The absolute values of the rates of variation in threshold voltage of the MOSFETs according to samples 1 and 2 are 1.9% and 3.1%, respectively, which are both not more than 8%. On the other hand, the absolute value of the amount of variation in threshold voltage of the MOSFET according to sample 3 is 0.27 V, which is more than 0.25 V. The absolute value of the rate of variation in threshold voltage of the MOSFET according to sample 3 is 8.1%, which is more than 8%.

TABLE 3

| Vgs = −10 V 175° C. | Total amount of Na [atom/cm²] | First Vth [V] | Second Vth [V] | Amount of variation [V] | Rate of variation [%] |
|---|---|---|---|---|---|
| Sample 1 | 3.00 × 10⁹ | 3.1 | 2.98 | −0.12 | −4.0 |
| Sample 2 | 1.40 × 10¹⁰ | 3.11 | 2.98 | −0.13 | −4.3 |
| Sample 3 | 1.10 × 10¹¹ | 3.08 | 2.77 | −0.31 | −11.2 |

As shown in Table 3, after the application of the gate bias stress in experiment B (175° C., Vgs=−10 V, 100 hours), the second threshold voltages of the MOSFETs according to samples 1 to 3 are 2.98 V, 2.98 V and 2.77 V, respectively, which are all not less than 2.5 V. The absolute values of the amounts of variation in threshold voltage of the MOSFETs according to samples 1 and 2 are 0.12 V and 0.13 V, respectively, which are both not more than 0.25 V. The absolute values of the rates of variation in threshold voltage of the MOSFETs according to samples 1 and 2 are 4.0% and 4.3%, respectively, which are both not more than 8%. On the other hand, the absolute value of the amount of variation in threshold voltage of the MOSFET according to sample 3 is 0.31 V, which is more than 0.25 V. The absolute value of the rate of variation in threshold voltage of the MOSFET according to sample 3 is 11.2%, which is more than 8%.

As shown in Tables 2 and 3, the total amounts of Na in the TEGs according to samples 1 and 2 are $3.00 \times 10^9$ atom/cm² and $1.40 \times 10^{10}$ atom/cm², respectively, which are both not more than $5 \times 10^{10}$ atom/cm². On the other hand, the total amount of Na in the TEG according to sample 3 is $1.10 \times 10^{11}$ atom/cm², which is more than $5 \times 10^{10}$ atom/cm². It is considered that the total amount of Na in the TEG is the same as the total amount of Na contained in interface region R. From the above results, it can be seen that in the MOSFET in which the total number of Na in interface region R is not more than $5 \times 10^{10}$ atoms/cm², the amount of variation in threshold voltage is not more than 0.25 V, the second threshold voltage is not less than 2.5 V, and the rate of variation in threshold voltage is not more than 8%.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 silicon carbide semiconductor device (MOSFET); 2a first virtual surface; 2b second virtual surface; 3 gate pad; 3a, 3b relation; 4 insulating film; 5 lid; 6 cover; 10 silicon carbide substrate; 10a first main surface; 10b second main surface; 11 silicon carbide single-crystal substrate; 12 first impurity region (drift region, silicon carbide epitaxial layer); 13 second impurity region (body region); 14 third impurity region (source region); 15 gate insulating film (silicon dioxide film); 15a first insulating film portion; 15b second insulating film portion (insulating film portion); 15b2 second interface; 15b1 first interface; 16 source electrode; 18 p type region; 18a contact region; 18b high-concentration p type region; 19 source interconnect; 20 drain electrode; 22 interlayer insulating film; 22a surface; 24 silicon carbide epitaxial layer; 27 gate electrode (polysilicon); 27a first electrode portion; 27b second electrode portion (electrode portion); 34 housing; 100 intermediate substrate; A position; BT bottom; CH channel region; OD off direction; R interface region; SW side surface; TR trench; W shortest distance; Y normal direction.

The invention claimed is:

1. A silicon carbide semiconductor device, comprising a silicon carbide substrate having a first main surface and a second main surface opposite to the first main surface,
the silicon carbide substrate including
a first impurity region having a first conductivity type,
a second impurity region provided on the first impurity region and having a second conductivity type different from the first conductivity type, and
a third impurity region provided on the second impurity region so as to be spaced from the first impurity region and having the first conductivity type,
the first main surface being provided with a trench, the trench defined by a side surface penetrating the third impurity region and the second impurity region to reach the first impurity region, and a bottom provided continuously with the side surface,
the first main surface being a {0001} plane, or a plane inclined at an angle of not more than 8° in an off direction relative to the {0001} plane,
an angle formed between the first main surface and the side surface being not less than 95° and not more than 130°,
the silicon carbide semiconductor device further comprising:
a gate insulating film in contact with the second impurity region at the side surface; and
a gate electrode provided on the gate insulating film,
in a stress test in which a gate voltage of at least one of −10 V and 20 V is applied to the gate electrode for 100 hours at a temperature of 175° C., where a threshold voltage before the stress test is defined as a first threshold voltage and a threshold voltage after the stress test is defined as a second threshold voltage, an absolute value of a difference between the first threshold voltage and the second threshold voltage being not more than 0.25 V, and the second threshold voltage being not less than 2.5 V,
the silicon carbide semiconductor device further comprising a gate pad connected to the gate electrode and facing the first main surface, wherein
the gate insulating film includes an insulating film portion provided between the first main surface and the gate pad,
the gate electrode includes an electrode portion provided on the insulating film portion, and
where an interface between the insulating film portion and the electrode portion is defined as a first interface, and a region of an interface between the insulating film portion and the silicon carbide substrate that faces the first interface is defined as a second interface, a value obtained by dividing a total number of sodium contained in an interface region, which lies between a first virtual surface distant from the first interface toward the electrode portion by a thickness of the insulating film portion along a normal direction of the first interface and a second virtual surface distant from the second interface toward the silicon carbide substrate by the thickness of the insulating film portion along a normal direction of the second interface, by an area of the first interface being not more than $5 \times 10^{10}$ atoms/cm².

2. A silicon carbide semiconductor device, comprising a silicon carbide substrate having a first main surface and a second main surface opposite to the first main surface, the silicon carbide substrate including
   a first impurity region having a first conductivity type,
   a second impurity region provided on the first impurity region and having a second conductivity type different from the first conductivity type, and
   a third impurity region provided on the second impurity region so as to be spaced from the first impurity region and having the first conductivity type,
the first main surface being provided with a trench, the trench defined by a side surface penetrating the third impurity region and the second impurity region to reach the first impurity region, and a bottom provided continuously with the side surface,
the first main surface being a {0001} plane, or a plane inclined at an angle of not more than 8° in an off direction relative to the {0001} plane,
an angle formed between the first main surface and the side surface being not less than 95° and not more than 130°,
the silicon carbide semiconductor device further comprising:
a gate insulating film in contact with the second impurity region at the side surface; and
a gate electrode provided on the gate insulating film,
in a stress test in which a gate voltage of at least one of −10 V and 20 V is applied to the gate electrode for 100 hours at a temperature of 175° C., where a threshold voltage before the stress test is defined as a first threshold voltage and a threshold voltage after the stress test is defined as a second threshold voltage, a value obtained by dividing an absolute value of a difference between the first threshold voltage and the second threshold voltage by the second threshold voltage being not more than 0.08, and the second threshold voltage being not less than 2.5 V,
the silicon carbide semiconductor device further comprising a gate pad connected to the gate electrode and facing the first main surface, wherein
the gate insulating film includes an insulating film portion provided between the first main surface and the gate pad,
the gate electrode includes an electrode portion provided on the insulating film portion, and
where an interface between the insulating film portion and the electrode portion is defined as a first interface, and a region of an interface between the insulating film portion and the silicon carbide substrate that faces the first interface is defined as a second interface, a value obtained by dividing a total number of sodium contained in an interface region, which lies between a first virtual surface distant from the first interface toward the electrode portion by a thickness of the insulating film portion along a normal direction of the first interface and a second virtual surface distant from the second interface toward the silicon carbide substrate by the thickness of the insulating film portion along a normal direction of the second interface, by an area of the first interface being not more than $5 \times 10^{10}$ atoms/cm$^2$.

3. The silicon carbide semiconductor device according to claim 1, wherein
   the off direction is either a direction within 5° in the {0001} plane relative to a <1-100> direction, or a direction within 5° in the {0001} plane relative to a <11-20> direction.

4. The silicon carbide semiconductor device according to claim 1, wherein
   the side surface includes a {03-38} plane.

* * * * *